(12) United States Patent
Di et al.

(10) Patent No.: US 11,749,647 B2
(45) Date of Patent: Sep. 5, 2023

(54) SEMICONDUCTOR DEVICE INCLUDING VERTICAL WIRE BONDS

(71) Applicant: WESTERN DIGITAL TECHNOLOGIES, INC., San Jose, CA (US)

(72) Inventors: Xiaofeng Di, Shanghai (CN); Junrong Yan, Shanghai (CN); CheeKeong Chin, Shanghai (CN); Weili Wang, Shanghai (CN); Xin Lu, Shanghai (CN); Qi Deng, Shanghai (CN); Chaur Yang Ng, Pulau Pinang (MY); Cong Zhang, Shanghai (CN); Chenlin Yang, Shanghai (CN); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/137,990

(22) Filed: Dec. 30, 2020

(65) Prior Publication Data

US 2021/0366875 A1 Nov. 25, 2021

(30) Foreign Application Priority Data

May 22, 2020 (CN) .......................... 202010441574.8

(51) Int. Cl.
*H01L 25/065* (2023.01)
*H01L 23/00* (2006.01)

(52) U.S. Cl.
CPC .......... *H01L 25/0657* (2013.01); *H01L 24/48* (2013.01); *H01L 2224/4845* (2013.01); *H01L 2224/48227* (2013.01); *H01L 2224/48455* (2013.01); *H01L 2225/06506* (2013.01); *H01L 2225/06562* (2013.01)

(58) Field of Classification Search
CPC ................. H01L 25/0657; H01L 24/48; H01L 2224/48227; H01L 2224/4845; H01L 2224/48455; H01L 2225/06506; H01L 2225/06562; H10B 80/00
See application file for complete search history.

(56) References Cited

U.S. PATENT DOCUMENTS

| | | | |
|---|---|---|---|
| 2003/0230796 A1 | 12/2003 | Ismail et al. | |
| 2009/0325344 A1* | 12/2009 | Takiar | H01L 24/97 438/109 |
| 2016/0181214 A1* | 6/2016 | Oh | H01L 27/222 257/777 |

* cited by examiner

*Primary Examiner* — Timor Karimy
(74) *Attorney, Agent, or Firm* — Vierra Magen Marcus LLP

(57) ABSTRACT

A semiconductor device includes a vertical column of wire bonds on substrate contact fingers of the device. Semiconductor dies are mounted on a substrate, and electrically coupled to the substrate such that groups of semiconductor dies may have bond wires extending to the same contact finger on the substrate. By bonding those wires to the contact finger in a vertical column, as opposed to separate, side-by-side wire bonds on the contact finger, an area of the contact finger may be reduced.

18 Claims, 16 Drawing Sheets

*Fig. 19*
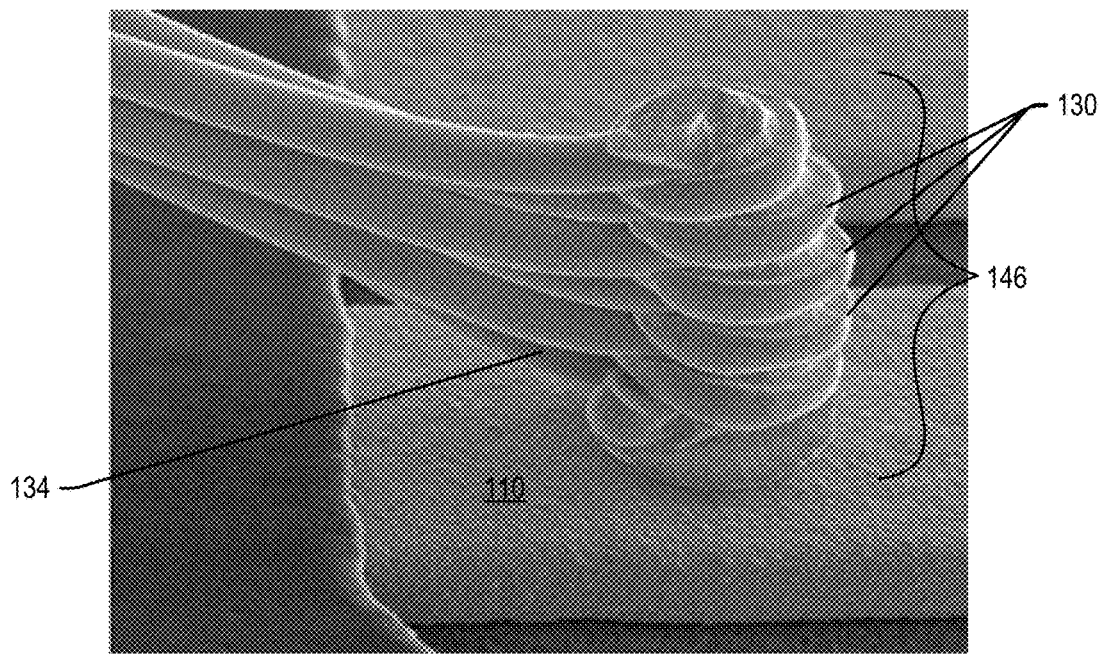
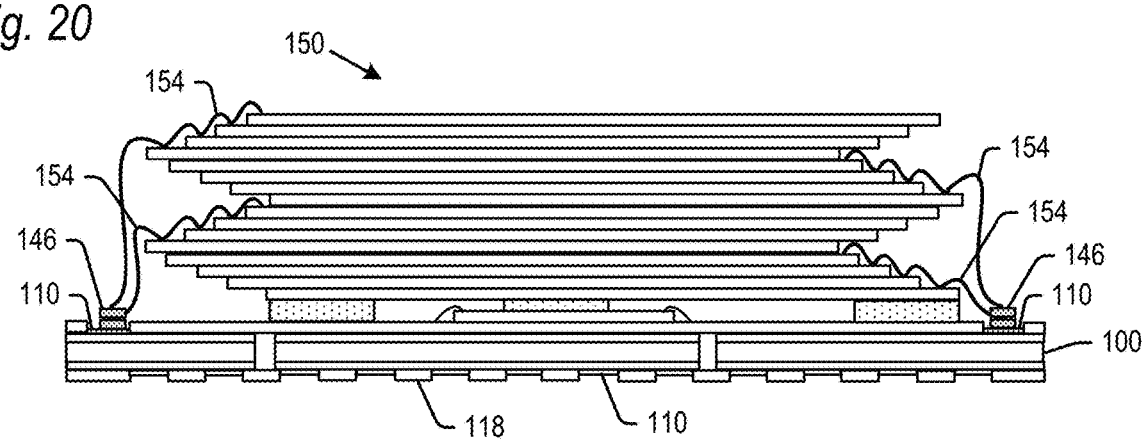
*Fig. 20*

SEMICONDUCTOR DEVICE INCLUDING VERTICAL WIRE BONDS

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory semiconductor devices may in general be fabricated as system-in-a-package (SIP) or multichip modules (MCM), where a plurality of semiconductor dies are mounted and interconnected to an upper surface of a small footprint substrate. The substrate may in general include a rigid, dielectric base having a conductive layer etched on one or both sides. Semiconductor dies in a die stack are often electrically connected to the substrate such that multiple bond wires extend from the stack and connect side-by-side with each other at separate, discrete positions on a single contact finger on the substrate. It is known to form these side-by-side wire bonds in a single line of separate positions on an individual contact finger. It is also known to form these wire bonds in an array of separate, side-by-side positions on an individual contact finger, such as for example two lines of wire bonds.

Whether in a single row or an array of wire bonds, forming separate, side-by-side wire bonds requires an area of a contact finger that is large enough to accommodate each of the individual bonds. Given the ever-present drive to increase the storage capacity of a given form factor semiconductor package, it is desirable to maximize the size of the semiconductor dies in the package. Contact fingers with separate wire bonds take up valuable space in the package that could otherwise be used to increase the size of the dies in the package.

DESCRIPTION OF THE DRAWINGS

FIG. 19 is an enlarged photographic view of a number of vertically-lformed wire bonds according to embodiments of the present technology.

FIG. 20 is a side view of a number of semiconductor dies mounted on a substrate according to an alternative embodiment of the present technology.

DETAILED DESCRIPTION

The present technology will now be described with reference to the figures, which in embodiments, relate to a semiconductor device including a vertical column of wire bonds on the substrate contact fingers of the device. Building the wire bonds vertically on the substrate contact fingers allows the contact fingers to be made smaller, thereby freeing up space in the device for larger semiconductor dies, via fences and/or other components. In general, semiconductor dies are mounted on a substrate, and electrically coupled to the substrate such that groups of semiconductor dies may have bond wires extending to the same contact finger on the substrate. By bonding those wires to the contact finger in a vertical column, as opposed to separate, side-by-side wire bonds on the contact finger, an area of the contact finger may be reduced.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5% of a given dimension.

Figure 1:
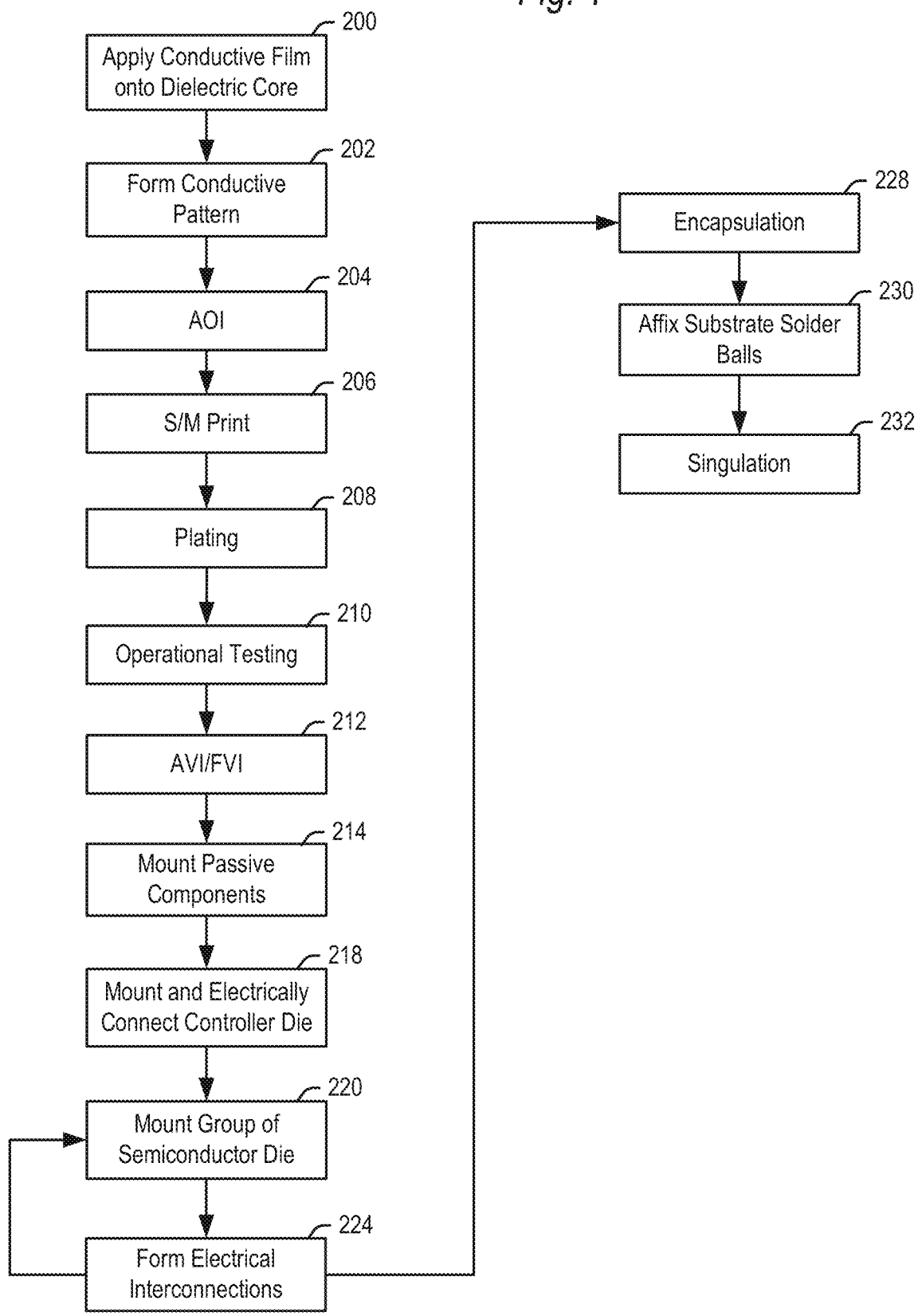
FIG. 1 is a flowchart of the overall fabrication process of a substrate and a semiconductor device using that substrate according to embodiments of the present technology.

A first embodiment of the present technology will now be explained with reference to the flowchart of FIG. 1 and the top, side and perspective views of FIGS. 2 through 21. Although the figures show an individual semiconductor device 150, or a portion thereof, it is understood that the device 150 may be batch processed along with a plurality of other semiconductor devices on substrate panels to achieve economies of scale. The number of rows and columns of devices 150 on the substrate panels may vary.

Figure 2:
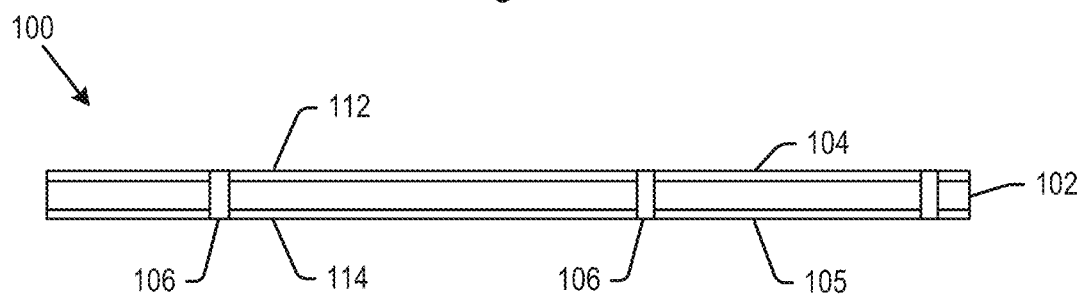
FIG. 2 is a side view of a substrate of a semiconductor device at a first step in the fabrication process according to an embodiment of the present technology.

The substrate panel for the fabrication of semiconductor device 150 begins with a plurality of substrates 100 (again, one such substrate is shown in FIGS. 2-21). The substrate 100 may be a variety of different chip carrier mediums, including a printed circuit board (PCB), a leadframe or a tape automated bonded (TAB) tape. Where substrate 100 is a PCB, the substrate may be formed of a core 102 as shown in FIG. 2. The core 102 may be formed of various dielectric materials such as for example, polyimide laminates, epoxy resins including FR4 and FR5, bismaleimide triazine (BT), and the like. The core may have a thickness of between 40 microns (µm) to 200 µm, although the thickness of the core may vary outside of that range in alternative embodiments. The core 102 may be ceramic or organic in alternative embodiments.

Figure 3:
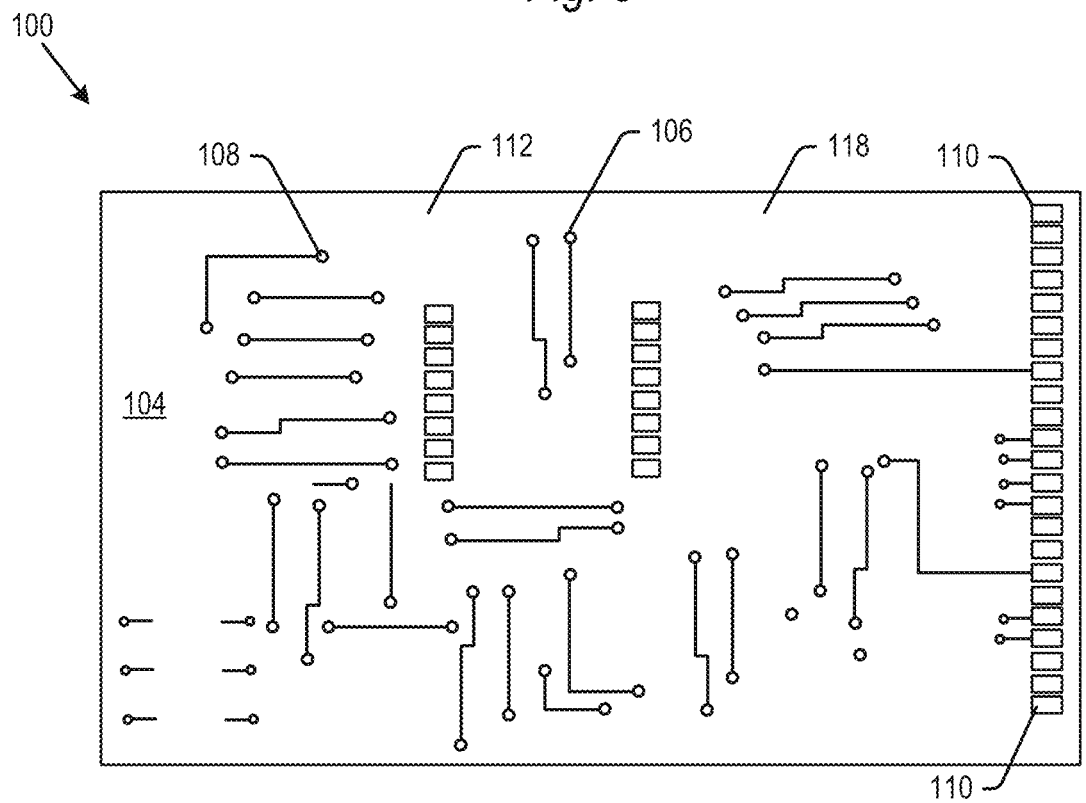
FIG. 3 is a top view of the substrate of FIG. 2.

In step 200, conductive layers 104 and 105 may be formed on the exposed planar surfaces of the dielectric core 102, as shown in the side and top views of FIGS. 2 and 3, respectively. The conductive layers 104, 105 may be formed of copper or copper alloys, plated copper or plated copper alloys, Alloy 42 (42Fe/58Ni), copper plated steel, or other metals and materials suitable for use on substrate panels. The conductive layers 104, 105 may have a thickness of about 8 µm to 40 µm, although the thickness of the layers may vary outside of that range in alternative embodiments.

In a step 202, a conductive pattern of vias, leads and/or pads are formed in and through the substrate 100. The substrate 100 may drilled to define through-hole vias 106, which are subsequently plated and/or filled with a conductive metal. A conductance pattern of electrical traces 108 and contact pads, or fingers, 110 may then be formed on the top and/or bottom major planar surfaces 112, 114 of substrate 100. FIG. 3 shows an example of a conductance pattern including traces 108 and contact fingers 110 formed on the first major planar surface 112 of substrate 100.

The pattern of vias, 106, traces 108 and contact fingers 110 shown in the figures are by way of example, and the substrate 100 may include more or less vias, traces and/or contact fingers in further embodiments, and they may be in different locations in further embodiments. The conductance pattern on the top and/or bottom surfaces of the substrate 100 may be formed by a variety of known processes, including for example various photolithographic processes.

Referring again to FIG. 1, the substrate 100 may next be inspected in step 204. This step may include an automatic optical inspection (AOI). Once inspected, a solder mask 118 may be applied to the upper and/or lower surfaces of the substrate and etched in step 206, as shown for example in the top, side and perspective views of FIGS. 3, 4 and 5, respectively. As seen for example in FIGS. 4 and 5, the solder mask may be etched at the contact finger 110 to create what may be referred to as a window around each contact finger 110. In embodiments, the window (and the contact finger 110 exposed through the window) may have a length and/or width of 50 µm to 70 µm, such as for example 55 µm. In embodiments, the contact fingers exposed through the solder mask may be square, but it is possible that the contact fingers may be rectangular (length greater than width), circular or oval in further embodiments.

After the solder mask is applied, the contact fingers 110, and any other etched areas to be soldered on the conductance patterns may be plated, for example, with a Ni/Au, Alloy 42, or the like, in step 208 in a known electroplating or thin film deposition process. The substrate 100 may next undergo operational testing in step 210 to ensure the substrate 100 is working properly. In step 212, the substrate may be visually inspected, including for example an automated visual inspection (AVI) and a final visual inspection (FVI) to check for contamination, scratches and discoloration. One or more of the above steps may be omitted or performed in a different order in further embodiments.

The above-described substrate 100 may have a thickness ranging between 0.05 mm and 0.3 mm, though the substrate 100 may have other thicknesses in further embodiments. In embodiments described above, the substrate 100 is a two layer substrate (two conductive layers sandwiched on a dielectric layer). In further embodiments, the substrate 100 may include more layers, such as for example a four layer substrate (four conductive layers interspersed around three dielectric layers).

Assuming the substrate 100 passes inspection, passive components 120 (FIGS. 4 and 5) may next be affixed to the substrate 100 in a step 214. The one or more passive components may include for example one or more capacitors, resistors and/or inductors, though other components are contemplated. The passive components 120 shown are by way of example only, and the number, type and position may vary in further embodiments.

Figure 4:
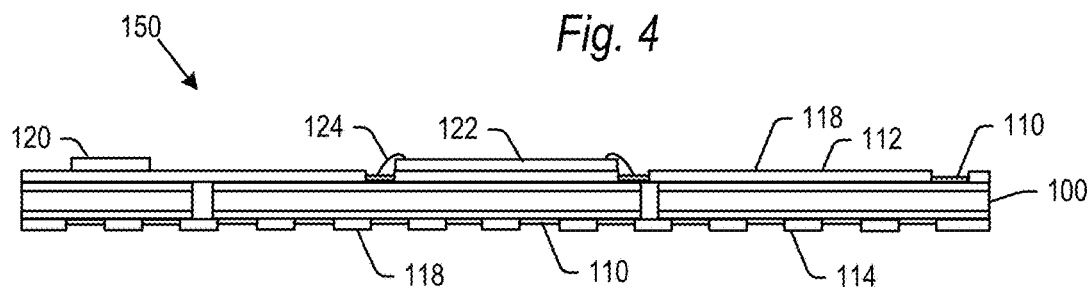
FIG. 4 is a side view of a substrate of a semiconductor device at a second step in the fabrication process according to an embodiment of the present technology.
Figure 5:
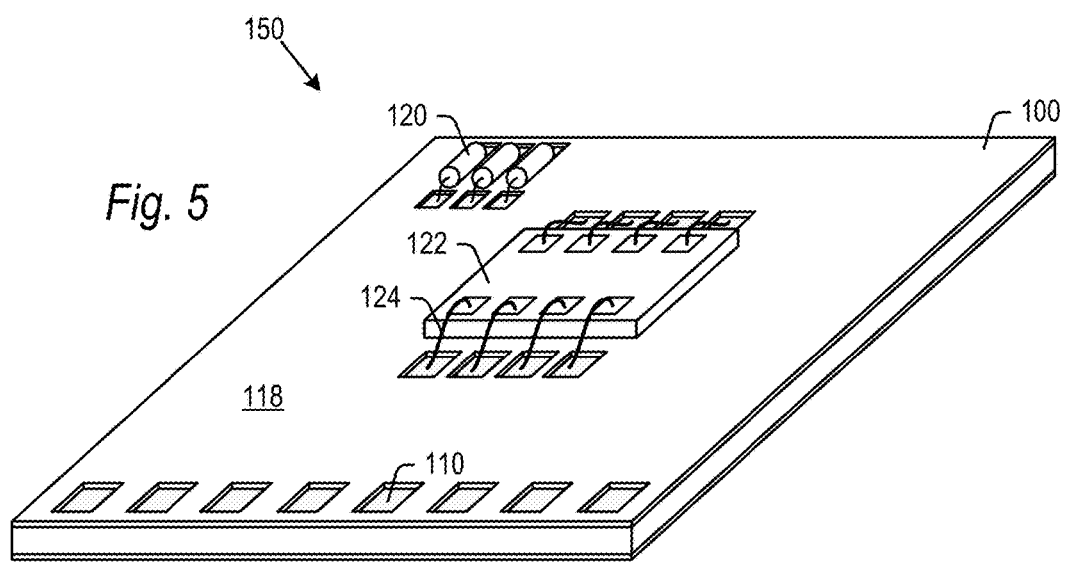
FIG. 5 is a perspective view of the substrate of FIG. 4.

In step 218, a controller die 122 may next be affixed to the substrate 100 as shown for example in FIGS. 4 and 5, such as by a die attach film (DAF) layer on an underside of the controller die 122. The controller die 122 may for example be an ASIC semiconductor chip, but may be other types of semiconductor dies in further embodiments. In one such further embodiment, die 122 may for example be an AI (artificial intelligence) semiconductor chip used to implement artificial intelligence processes with respect to data stored on the memory dies (explained below).

The controller die 122 may be electrically coupled to the substrate 100 using bond wires 124, though other methods may be used such as flip-chip bonding. The number of bond wires 124 are shown by way of example only and there may be more bond wires in further embodiments. The bond wires may extend off of one side, two sides (as shown), three sides or all four sides of the controller die 122 in further embodiments.

Figure 6:
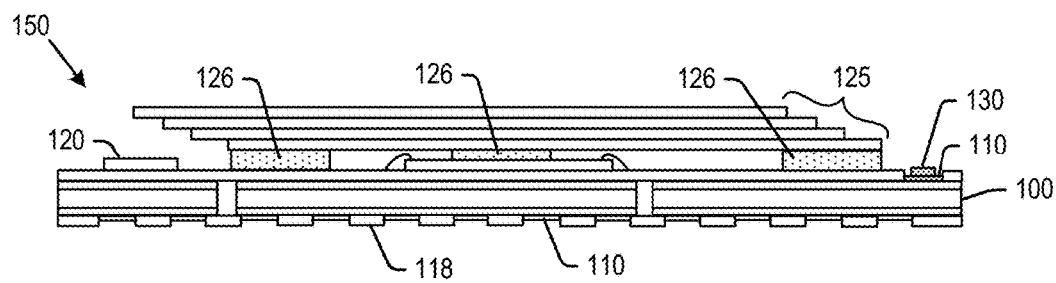
FIG. 6 is a side view of a number of semiconductor dies mounted on a substrate according to embodiments of the present technology.
Figure 7:
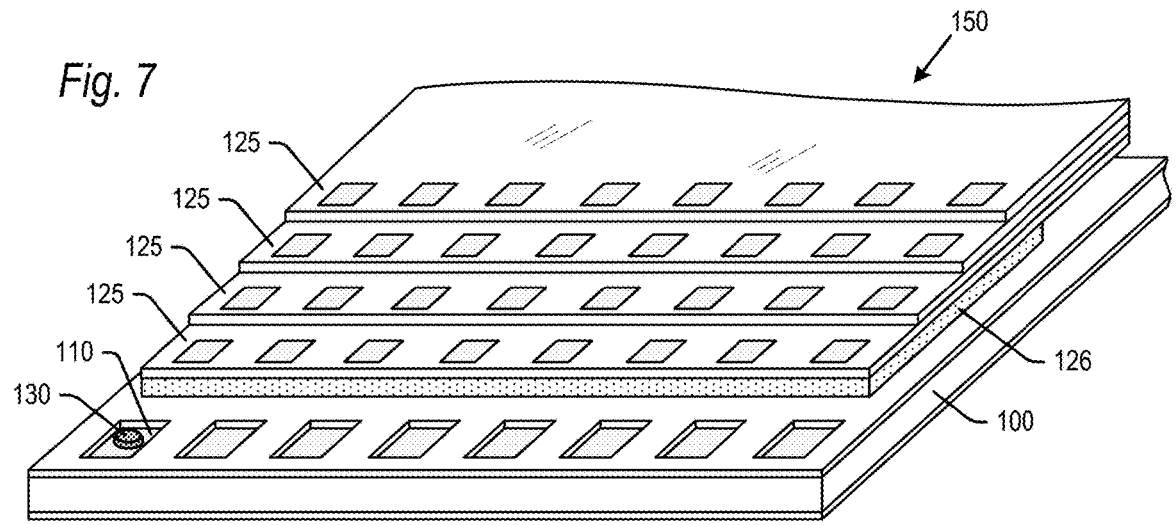
FIG. 7 is an enlarged partial view of a corner of the substrate of FIG. 6 showing a wire bond capillary forming solder bumps on contact fingers of the substrate.

In step 220, a first group of one or more semiconductor dies 125 may be mounted on the substrate 100, as shown in the side and perspective views of FIGS. 6 and 7. While four semiconductor dies are shown in the first group (and subsequent groups discussed below), it is understood that each of the groups of semiconductor dies 125 may include other numbers of semiconductor dies, including for example 1, 2, 8, 16 and 32 semiconductor dies. There may be other numbers of dies in each group in further embodiments. The semiconductor dies 125 may for example be memory dies such as 2D NAND flash memory or 3D BiCS (Bit Cost Scaling), V-NAND or other 3D flash memory, but other types of dies 125 may be used. These other types of semiconductor die include but are not limited to a controller die such as an ASIC, or RAM such as an SDRAM, DDR SDRAM, LPDDR and GDDR.

The first group of semiconductor die(s) 125 may be spaced above the surface 112 of the substrate 100 by spacers 126 to leave room for the controller die 122 and any bond wires 124. The particular arrangement of spacers 126 may vary in different embodiments. The dies 125 may include a DAF layer for affixing to each other and upper surfaces of the spacers 126. As one example, the DAF layer on the semiconductor dies 125 and controller die 122 may be cured to a B-stage to preliminarily affix the dies to each other, the substrate and the spacers, and subsequently cured to a final C-stage to permanently affix the dies 122, 125 within the semiconductor device 150.

Where multiple semiconductor dies 125 are included in a group, the semiconductor dies 125 may be stacked atop each other in a variety of configurations. In one example, the dies are stacked in an offset stepped configuration to form a die stack as shown for example in FIGS. 6 and 7. In such a configuration, the bond pads on each semiconductor die in the die stack are left exposed and accessible for wire bonding.

Figure 8:
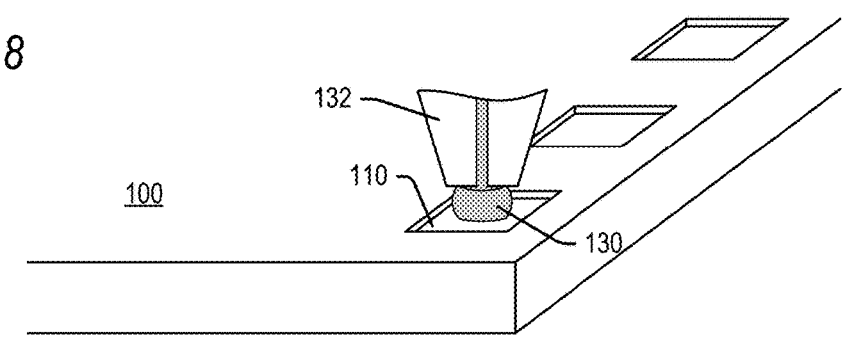
FIG. 8 is a perspective view of the semiconductor dies and the substrate of FIG. 6.

In step 224, the semiconductor dies 125 in the first group may be electrically interconnected to each other and to the contact fingers 110 of the substrate 100. In accordance with aspects of the present technology, wire bonds from the multiple groups of semiconductor dies 125 are bonded to a single contact finger using a column of vertically built wire bonds on the contact finger. In a first step in this process, a ball bump 130 may be deposited on a contact finger 110 as shown in FIG. 6-8. Referring specifically to FIG. 8, a wire bond capillary 132 may melt and deposit a discrete amount of metal onto a contact finger 110, and then flatten the ball and form the ball bump 130 adhered to the contact finger 110 using thermo-compression (e.g., at 150° C.) and/or ultrasonic energy (e.g., at 120 kHz). The ball bump 130 may be formed of Gold, but may be formed of other materials including Copper, Silver, Aluminum and alloys such as Palladium-Silver. The first ball bump 130 deposited on the contact fingers 110 may for example provide a bonding surface (on top of the ball bump) above the solder mask window.

Figure 9:
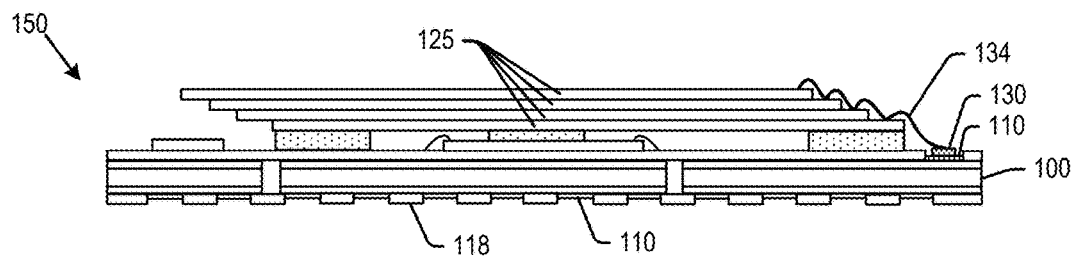
FIG. 9 is a side view of a number of semiconductor dies mounted on a substrate according to embodiments of the present technology.
Figure 10:
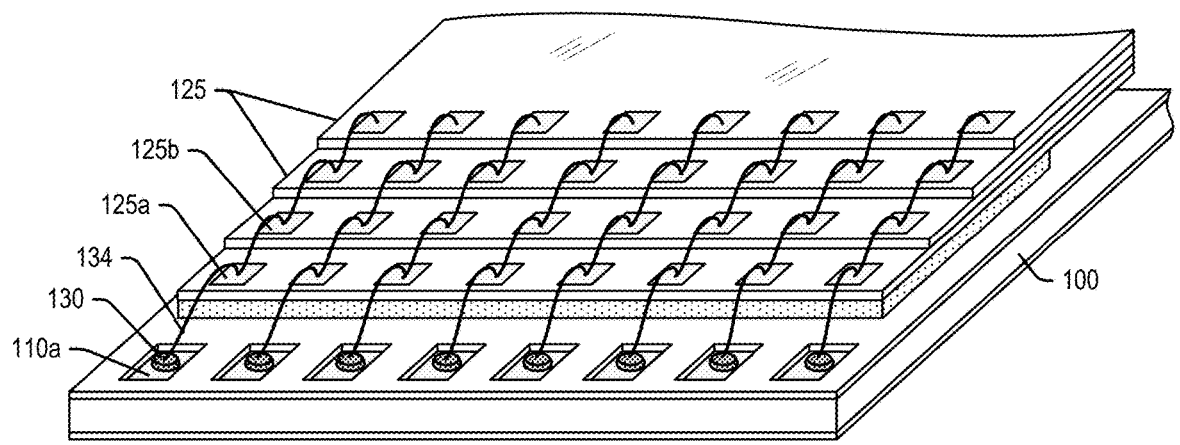
FIG. 10 is a perspective view of the semiconductor dies and the substrate of FIG. 9.

Next, the first set (e.g., on the left edges) of semiconductor dies 125 in the first group may be wire bonded to each other and to the contact finger 110 having the ball bump 130 on substrate 100. In embodiments, wire bonds may be formed using the so-called ball stitch on bump, or stand-off stitch, technique. In this technique, as shown in FIGS. 9 and 10, the wire bond capillary 132 may form a ball on a first die bond pad of the bottommost die (for example, on pad 125a at the left side of the first die 125). The capillary may then pays out wire and forms a stitch bond on top of the corresponding ball bump 130 on contact finger 110a, thus forming bond wire 134. The capillary may break the wire, move up and form a ball on the first die bond pad of the second die in the stack (for example, on pad 125b of the second die 125). The capillary may then pay out wire and form a stitch bond on top of the wire bond formed on pad 125a, thus forming the next bond wire 134.

This process continues up the die stack, connecting all of the corresponding die bond pads, having the same functionality, of the dies 125 in the stack. This process then repeats across the die stack, depositing a ball bump 130 on a contact finger, and then bonding the corresponding die bond pads up the stack, until the contact fingers 110 and bond pads of all of the dies are bonded to each other, as shown in FIG. 10. It is understood that the bond wires 134 may be bonded on ball bumps 130 by other bonding techniques to electrically connect the corresponding die bond pads to each other and the substrate 100.

The above processes for steps 220 and 224 may be repeated to add and electrically connect additional groups of dies to the semiconductor device 150. In accordance with aspects of the present technology, each electrical coupling between a new group of dies and the contact fingers 110 on substrate 100 is formed directly on top of a previously-formed electrical coupling so that the wire bonds on contact fingers 110 build vertically upward in a single file column. This concept will be explained in greater detail below with respect to FIGS. 11-18.

Figure 11:
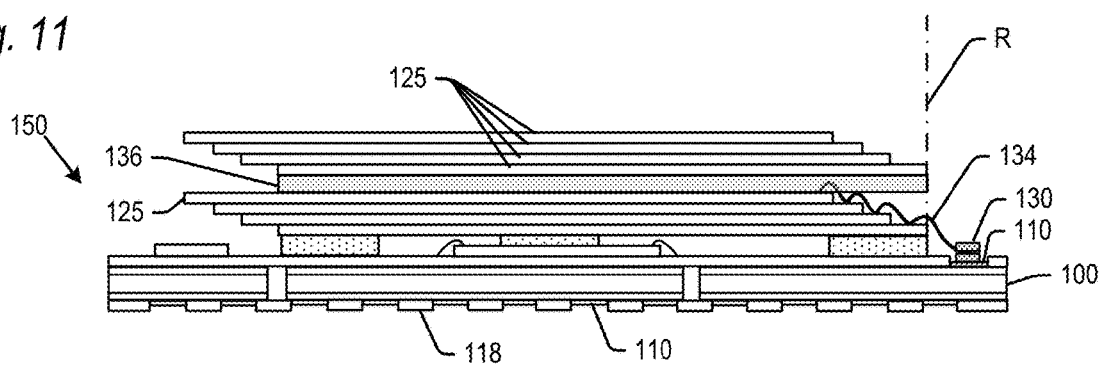
FIG. 11 is a side view of a number of semiconductor dies mounted on a substrate according to embodiments of the present technology.
Figure 12:
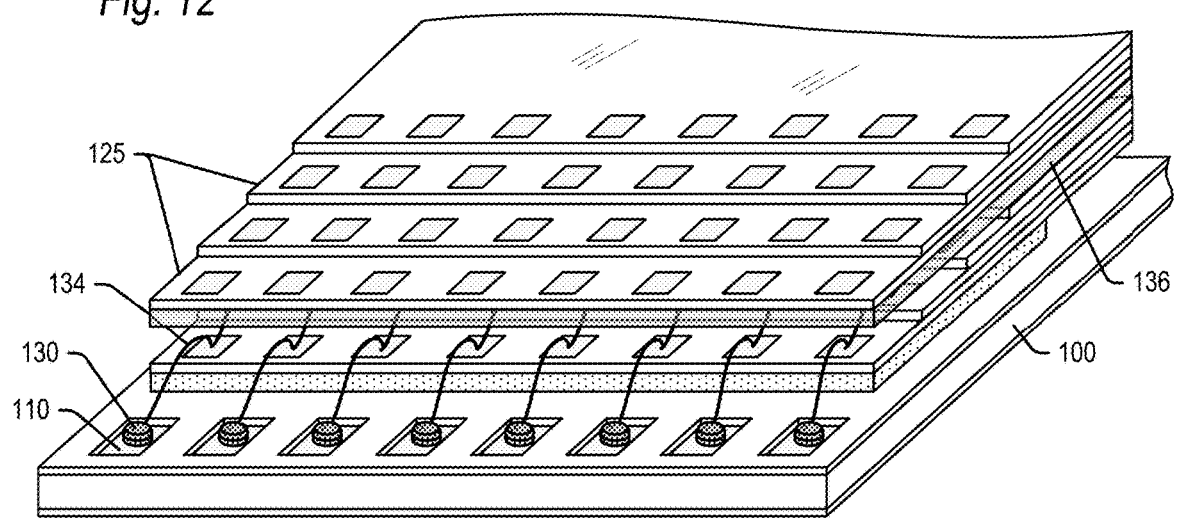
FIG. 12 is a perspective view of the semiconductor dies and the substrate of FIG. 11.

The side and perspective views of FIGS. 11 and 12 show a second group of semiconductor dies mounted on top of the first group. The second group of dies may have the same stepped offset as the first group, with a front edge of the bottommost dies in the first and second groups being aligned with each other in a reference plane R. A wire embed film (WEF) layer 136 may be applied between adjacent groups of dies to allow space for the bond wires 134 off the top die in the lower group.

Figure 13:
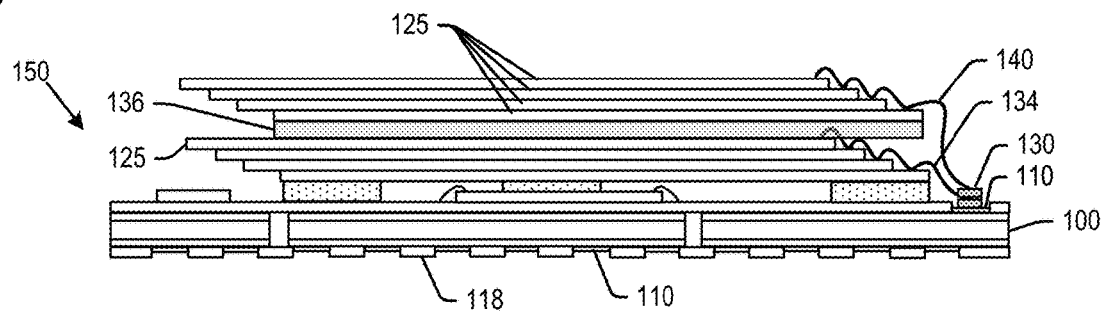
FIG. 13 is a side view of a number of semiconductor dies mounted on a substrate according to embodiments of the present technology.
Figure 14:
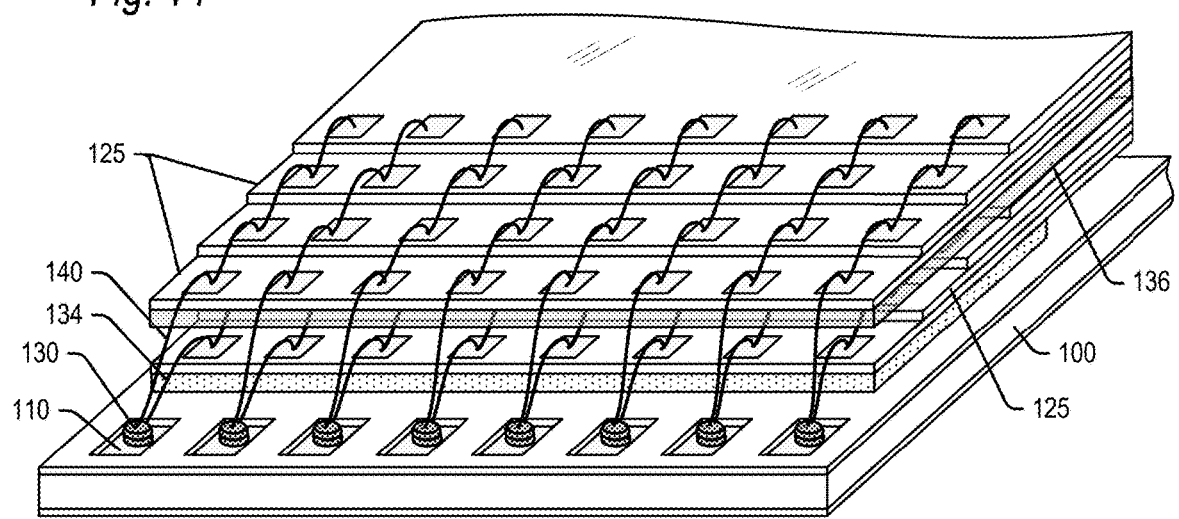
FIG. 14 is a perspective view of the semiconductor dies and the substrate of FIG. 13.

A second ball bump 130 may also be applied directly on top of the existing stitch bond and ball bump 130 on each contact finger 110. The second ball bump 130 may be applied in the same manner as the first ball bump 130. Referring now to FIGS. 13 and 14, bond wires 140 may then be formed as described above with respect to bond wires 134 to electrically couple the second group of semiconductor dies 125 to each other and the substrate 100. The bond wires 140 extending from the bottommost die of the second group may be stitch bonded directly on top of the second ball bump 130.

Figure 15:
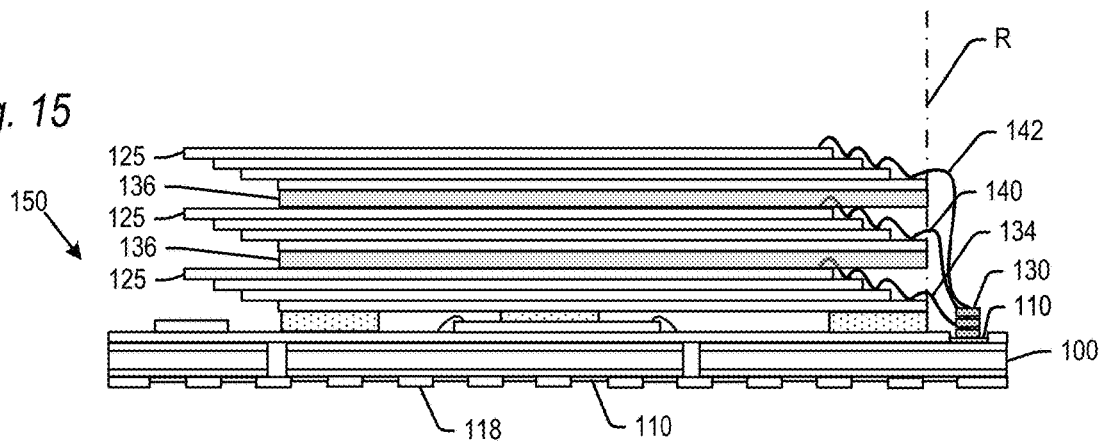
FIG. 15 is a side view of a number of semiconductor dies mounted on a substrate according to embodiments of the present technology.
Figure 16:
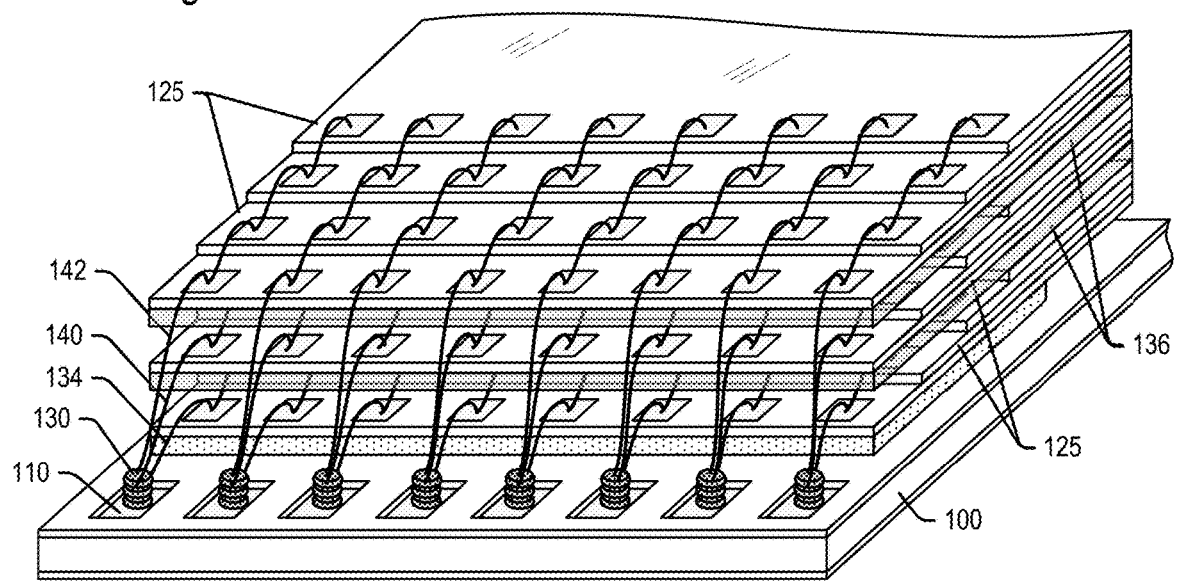
FIG. 16 is a perspective view of the semiconductor dies and the substrate of FIG. 15.

FIGS. 15 and 16 are side and perspective views showing another (a third) group a semiconductor dies 125 mounted on top of the second group. The third group of dies is provided with the same stepped offset, and the lowermost die in each of the three groups has a front edge aligned with the reference plane R. The third group of dies may be separated from the second group of dies by a WEF layer 136.

A third ball bump 130 may also be applied directly on top of the existing stitch bonds and ball bumps 130 on each contact finger 110. The third ball bump 130 may be applied in the same manner as the first and second ball bumps 130. Bond wires 142 may then be formed as described above to electrically couple the third group of semiconductor dies 125 to each other and the substrate 100. The bond wires 142 extending from the bottommost die of the third group may be stitch bonded directly on top of the third ball bump 130.

Figure 17:
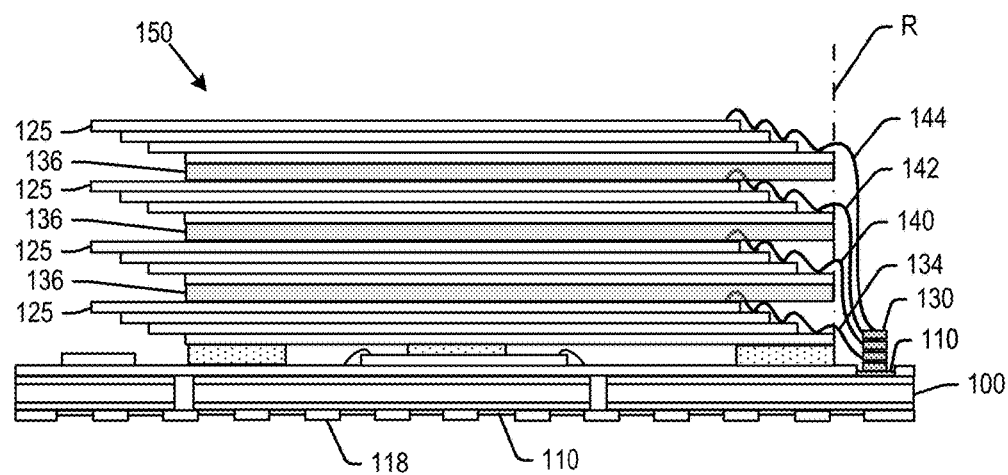
FIG. 17 is a side view of a number of semiconductor dies mounted on a substrate according to embodiments of the present technology.
Figure 18:
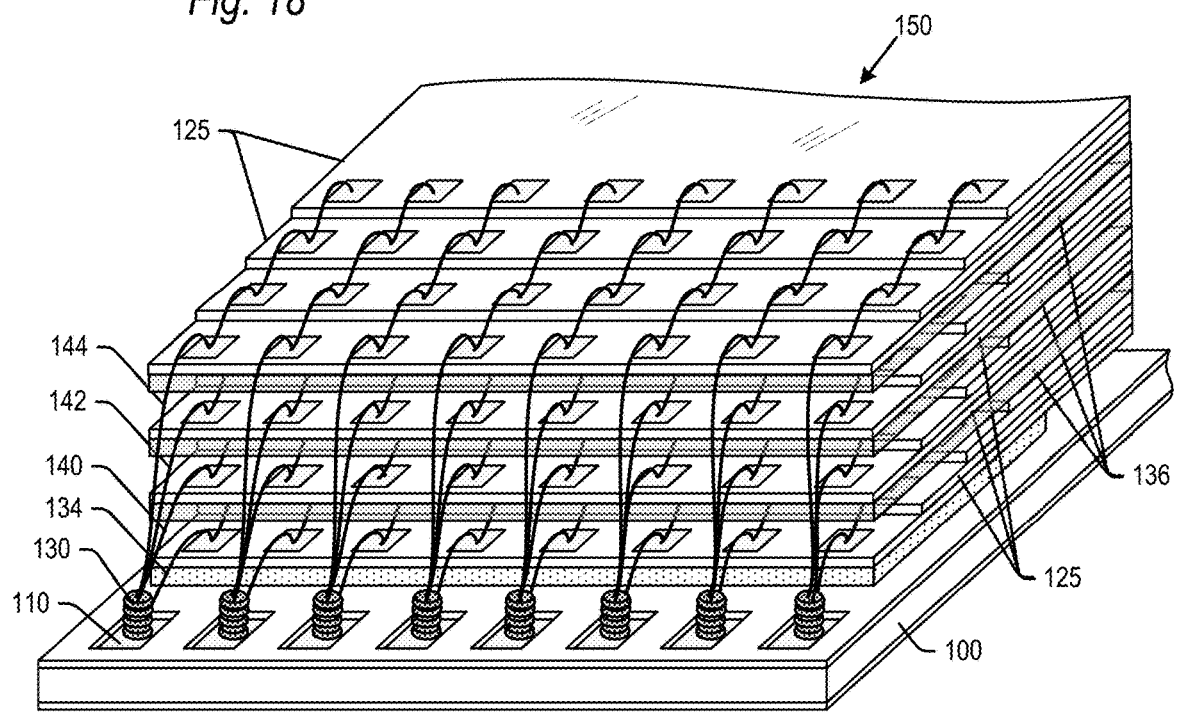
FIG. 18 is a perspective view of the semiconductor dies and the substrate of FIG. 17.

FIGS. 17 and 18 are side and perspective views showing another (a fourth) group a semiconductor dies 125 mounted on top of the third group. The fourth group of dies is provided with the same stepped offset, and the lowermost die of each of the four groups has a front edge aligned with the reference plane R. The fourth group of dies may be separated from the third group of dies by a WEF layer 136.

A fourth ball bump 130 may also be applied directly on top of the existing stitch bonds and ball bumps 130 on each contact finger 110 in a vertical column. The fourth ball bump 130 may be applied in the same manner as the first, second and third ball bumps 130. Bond wires 144 may then be formed as described above to electrically couple the fourth group of semiconductor dies 125 to each other and the substrate 100. The bond wires 144 extending from the bottommost die of the fourth group may be stitch bonded directly on top of the fourth ball bump 130.

As seen for example in FIGS. 17 and 18, the multiple connections from the different groups of semiconductor dies 125 to respective contact fingers 110 are built in a single vertical column, thereby minimizing the footprint of the wire bonds together on contact finger 110. In embodiments, the total footprint of the wire bonds may be the area of a single ball bond, which in embodiments may have a diameter of 50 μm to 55 μm, such as for example 52.4 μm. Thus, as noted above, the size of contact fingers 110 may be reduced relative to conventional contact fingers, where each bond wire had its own separate, side-by-side connection on a single contact finger. As one example, providing a contact finger that is 55 μm×55 μm offers a 26% reduction in the length, and a 33% reduction in area, relative to a conventional contact finger. As another example, providing a contact finger that is 55 μm×55 μm offers an 80% reduction in the length, and an 80% reduction in area, relative to a conventional contact finger having four discrete wire bonds in a straight line.

It is a feature of the present technology to minimize the size of a contact finger receiving multiple wire bonds, where a wire bond may comprise ball bumps and stitch bonds. As noted, a ball bump may have a footprint diameter of 55 μm, resulting in an area of 2376 μm. The contact finger on which multiple such ball bumps may be formed may have a length and width of 55 μm, resulting in an area of 3025 μm. Thus, the present technology allows multiple ball bumps on a single contact finger, where the total area of the contact finger is as little as 27.3% greater than the area of a single ball bump, or less than 28% greater than the area of a single ball bump.

Such contact fingers are smaller than were previously known for receiving multiple wire bonds. For example, conventional contact fingers receiving two wire bonds had to have an area that was at least twice as big as the area of a wire bond, as those wire bonds were conventionally formed side-by-side with each other on the contact finger. Reducing the size of a contact finger receiving multiple wire bonds frees up valuable space on the substrate. That freed-up space may be used for larger semiconductor dies, which in turn provides the significant benefit of greater storage capacity without increasing the overall form factor of the semiconductor device. Alternatively, the freed-up space may be used for features that enhance the performance of the semiconductor device. For example, the freed-up space may be used for one or more via fences, which are a lines of vias used to improve electrical isolation between components which would otherwise generate noise and crosstalk through coupling of electromagnetic fields. The freed-up space may be used for other purposes in further embodiments.

At present, ball bumps are made with a diameter of 50 μm to 55 μm, thus defining the minimum dimensions of a contact finger. It is conceivable that ball bumps be made smaller in the future. Thus, for example, where a ball bump becomes available with a diameter of 40 μm to 50 μm, a contact finger according to the present technology may be provided with a length and/or width of 40 μm to 50 μm. Where, for example, a ball bump becomes available with a diameter of 30 μm to 40 μm, a contact finger according to the present technology may be provided with a length and/or width of 30 μm to 40 μm.

It is understood that the number of groups of semiconductor dies may be greater or lesser than four in further embodiments, including for example 2, 3, 5 and 6 groups. Other numbers of groups are possible. FIG. 19 shows a magnified photographic view of an actual vertical column 146 on a contact finger 110. The column 146 is comprised of six ball bumps 130 and six stitch bonds 148 from bond wires (e.g., bond wire 134) extending to six stacked groups of semiconductor dies.

In embodiments ascribed above, the die bond pads are provided on one side of the semiconductor dies 125, and all bond wires extend off a single side of the die stack. In further embodiments, such as shown in FIG. 20, adjacent groups of dies may step in opposite directions, with bond wires 154 extending off of both sides of the die stack. In such embodiments, the substrate 100 may include contact fingers 110 on opposed edges of the substrate. In such an embodiment, the vertical columns 146 comprised of ball bumps 130 and stitch bonds may be formed on each of the contact fingers at both edges of the substrate 100. The embodiment shown in FIG. 20 includes two groups of dies having wire bonds extending off a first edge of the semiconductor device 150, and two groups of dies having wire bonds extending off the second, opposed edge of the semiconductor device 150. It is understood that this embodiment may include greater or lesser numbers of groups in further embodiments.

Figure 21:
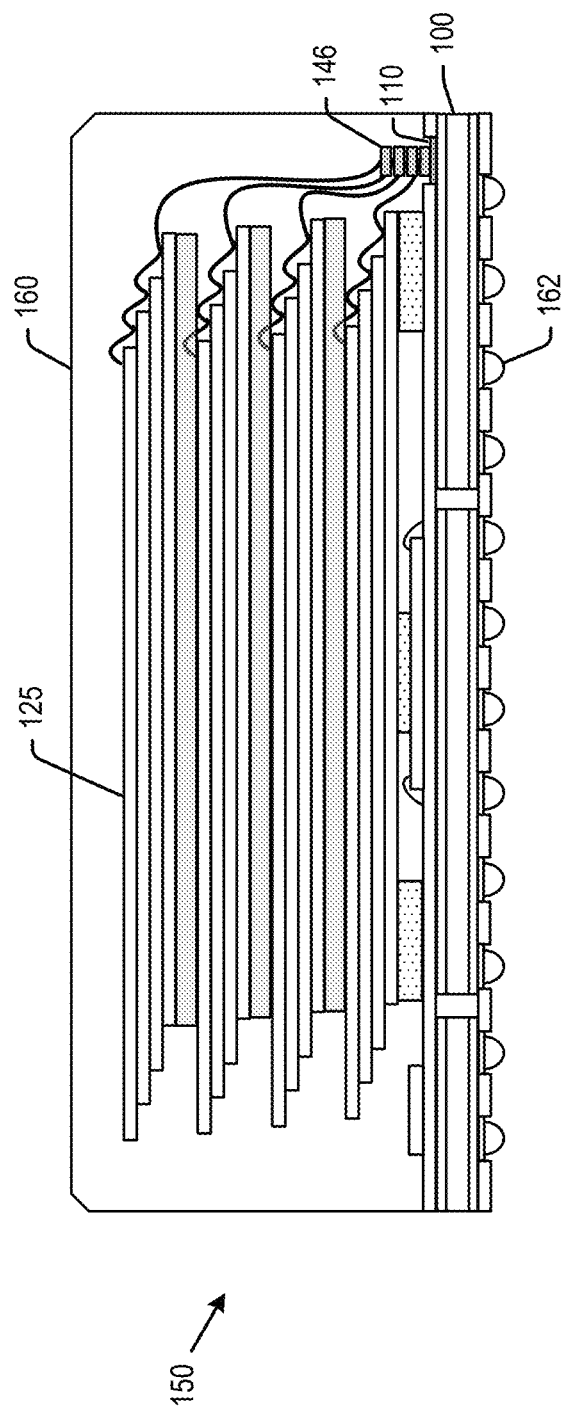
FIG. 21 is a side view of a completed semiconductor device according to embodiments of the present technology.

Following electrical connection of the groups of dies 125 to each other and the substrate 100, the semiconductor device 150 may be encapsulated in a mold compound 160 in a step 228 and as shown in FIG. 21. Mold compound 160 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, FFT (flow free thin) molding, transfer molding or injection molding techniques.

In step 230, solder balls 162 may be affixed to the contact fingers 110 on a lower surface 114 of substrate 100 as shown in FIG. 21. The solder balls 162 may be used to solder the semiconductor device 150 to a host device, such as a printed circuit board. The solder balls 162 may be omitted in embodiments where the semiconductor device 150 is to be used as a land grid array (LGA) package. After encapsulation and formation of solder balls 162 (where included), the semiconductor device may be singulated from the substrate panel in step 232 to form the finished semiconductor device 150 shown in FIG. 21.

Figure 22:
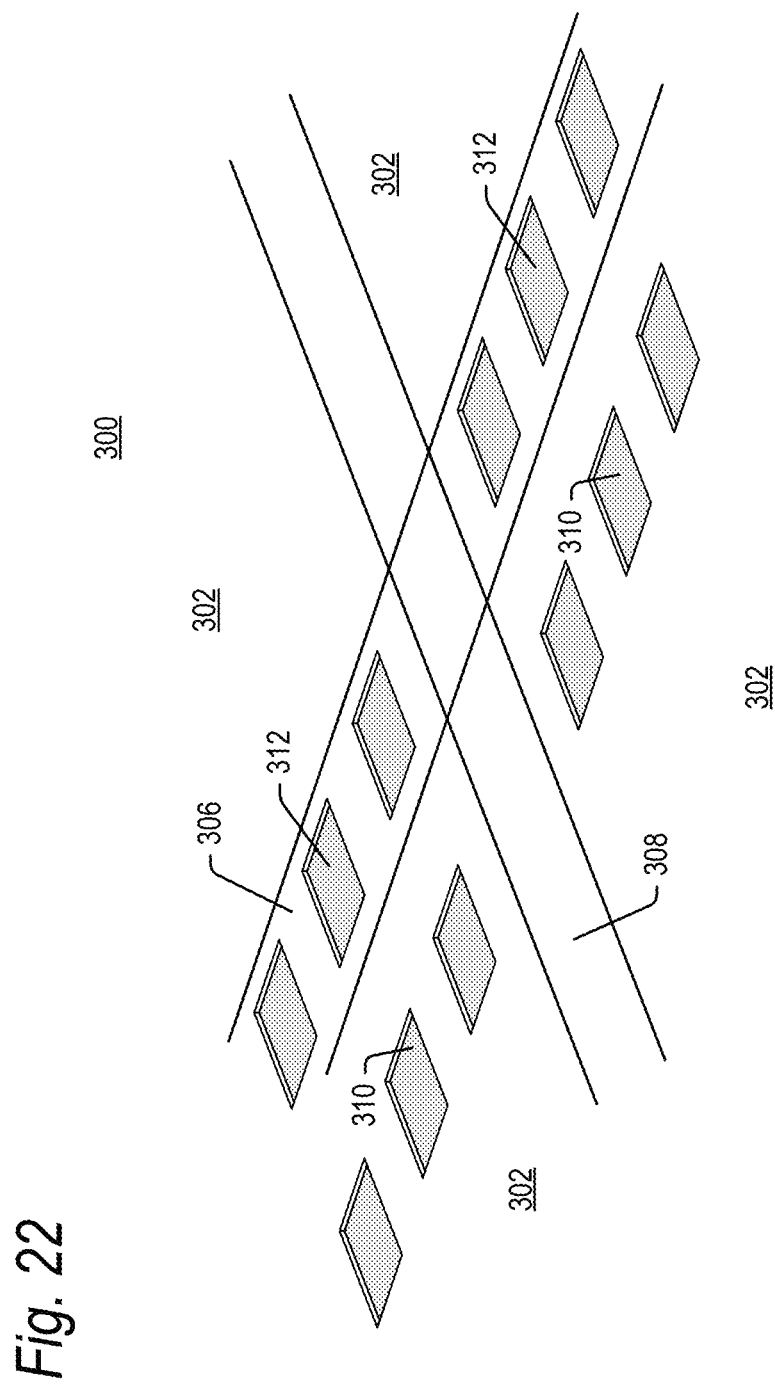
FIG. 22 is a perspective view of a number of substrates on a substrate panel including contact fingers and dummy contact fingers according to a further embodiment of the present technology.

FIGS. 1-21 relate to a first embodiment for minimizing the size of a contact finger on a substrate by forming all wire bonds in a single vertical column. FIGS. 22-30 relate in further embodiments for minimizing the size of the contact finger substrate receiving multiple wire bonds. FIG. 22 is a perspective view illustrating a portion of an upper surface of a substrate panel 300. The panel 300 includes an array of substrates 302 separated by first and second keep-out areas 306 and 308, which may be orthogonal to each other. This embodiment further include a number of dummy contact fingers 312 paired with each of the contact fingers 310.

Each substrate 302 includes a number of contact fingers 310 which may be similar in size and construction to contact fingers 110 described above. In the embodiment shown in FIG. 22, the dummy contact fingers 312 may be in keep-out area 306, i.e., the keep-out area adjacent the edge of the substrates 302 including the contact fingers 310.

Figure 23:
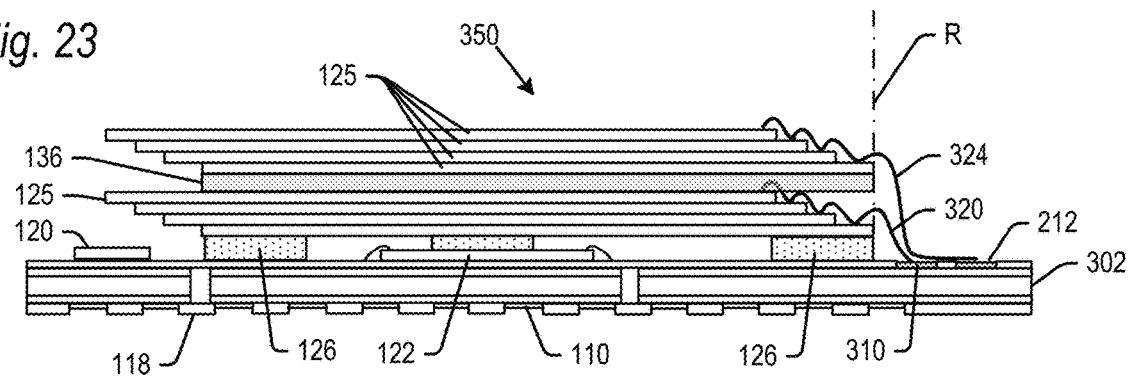
FIG. 23 is a side view of a number of semiconductor dies mounted on a substrate according to an alternative embodiment of the present technology.
Figure 24:
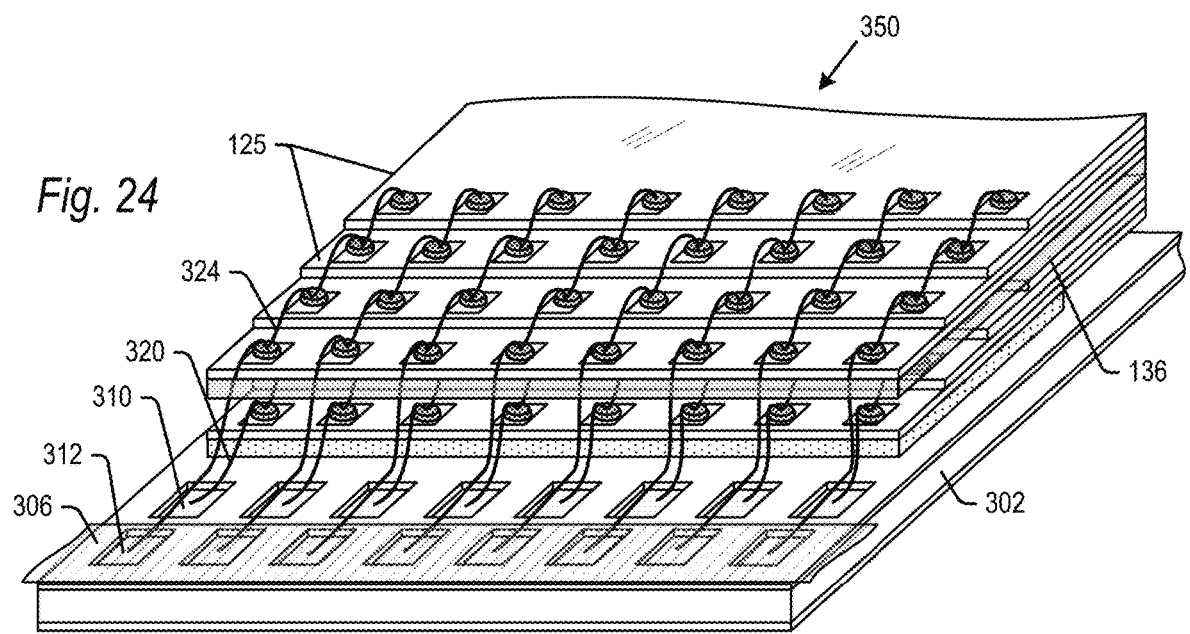
FIG. 24 is a perspective view of the semiconductor dies and the substrate of FIG. 23.

FIGS. 23 and 24 are side and perspective views of a semiconductor device 350 constructed using a substrate 302 shown in FIG. 22. While a single semiconductor device 350 is shown, it is understood that the device 350 of FIGS. 23 and 24 is part of a panel 300 of such devices 350 at the stage of fabrication shown. The semiconductor device 350 of FIGS. 23 and 24 is similar in composition and construction to the semiconductor device 150 shown in FIGS. 13 and 14, except for the distinctions noted below. As in the device 150 of FIGS. 13 and 14, the device 350 may include passive components 120 and a controller die 122 mounted to the substrate 302, and two groups of semiconductor dies 125 mounted above the controller die 122 by spacers 126. The two groups of dies 125 may be mounted in a stepped, offset configuration as described above, with a bottommost die of both groups having a front edge aligned in reference plane R. While each group is shown as having four semiconductor dies 125, the groups may have more or less dies in further embodiments. The groups of dies may be separated by a WEF layer 136.

Substrate 302 may similar in construction to substrate 100 described above, with the exception that it further includes dummy contact fingers 312 in keep-out area 306 as noted above. As seen in FIGS. 23 and 24, and the enlarged partial side views of FIGS. 25 and 26, bond wires 320 may be provided to electrically couple the die bond pads of the first (lower) group of dies 125 to each other and the contact fingers 310 of substrate 302. Wire bonds may be formed by a ball bonding technique, where a ball is deposited for example on a first die bond pad of the lowermost die in the first group. The wire bond capillary then pays out wire and forms a stitch bond on the first contact finger 310. The wire bond capillary then continues up the stack of the first group, and then across the stack. In embodiments, the contact fingers 310 do not have a ball bump initially deposited thereon, though it is conceivable that they could include an initial ball bump, and the stitch bond be formed on top of the ball bump as described above.

Bond wires 324 may be provided to electrically couple the die bond pads of the second (upper) group of dies 125 to each other and the dummy contact fingers 312 of substrate 302. Wire bonds with wires 324 may be formed in the same manner as with wires 320. In embodiments, the dummy contact fingers 312 do not have a ball bump initially deposited thereon, though it is conceivable that they could include an initial ball bump, and the stitch bond be formed on top of the ball bump as described above.

Figure 25:
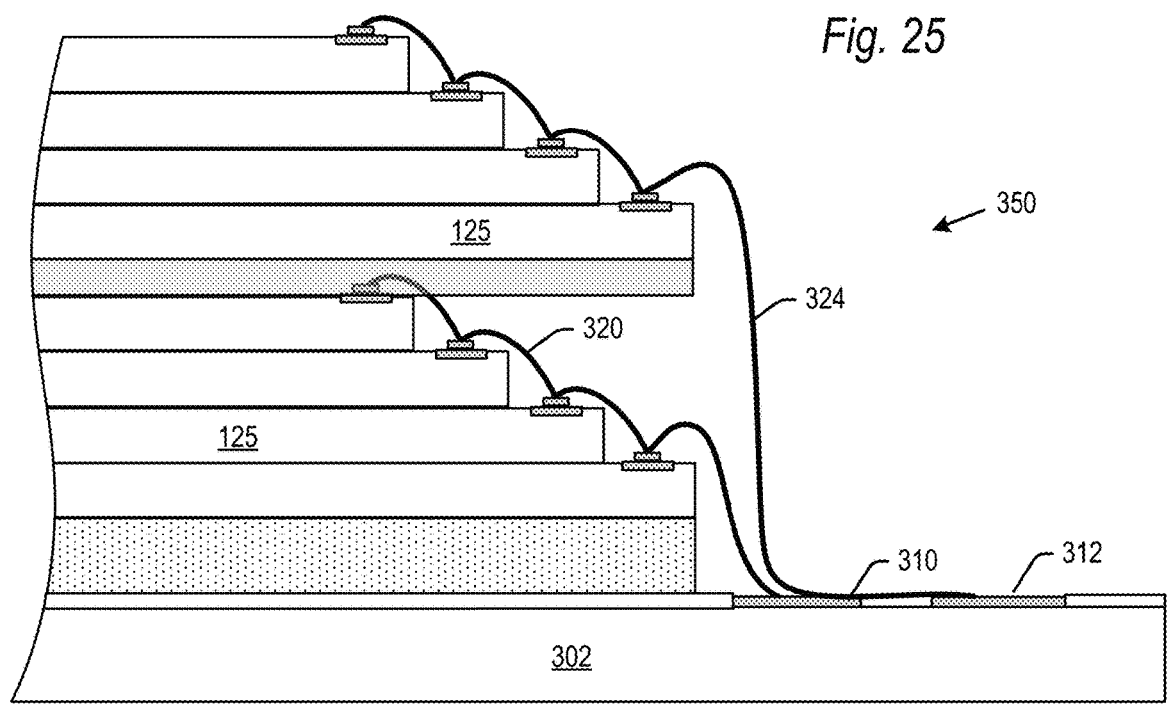
FIG. 25 is an enlarged side view of the semiconductor dies and substrate shown in FIG. 23.
Figure 26:
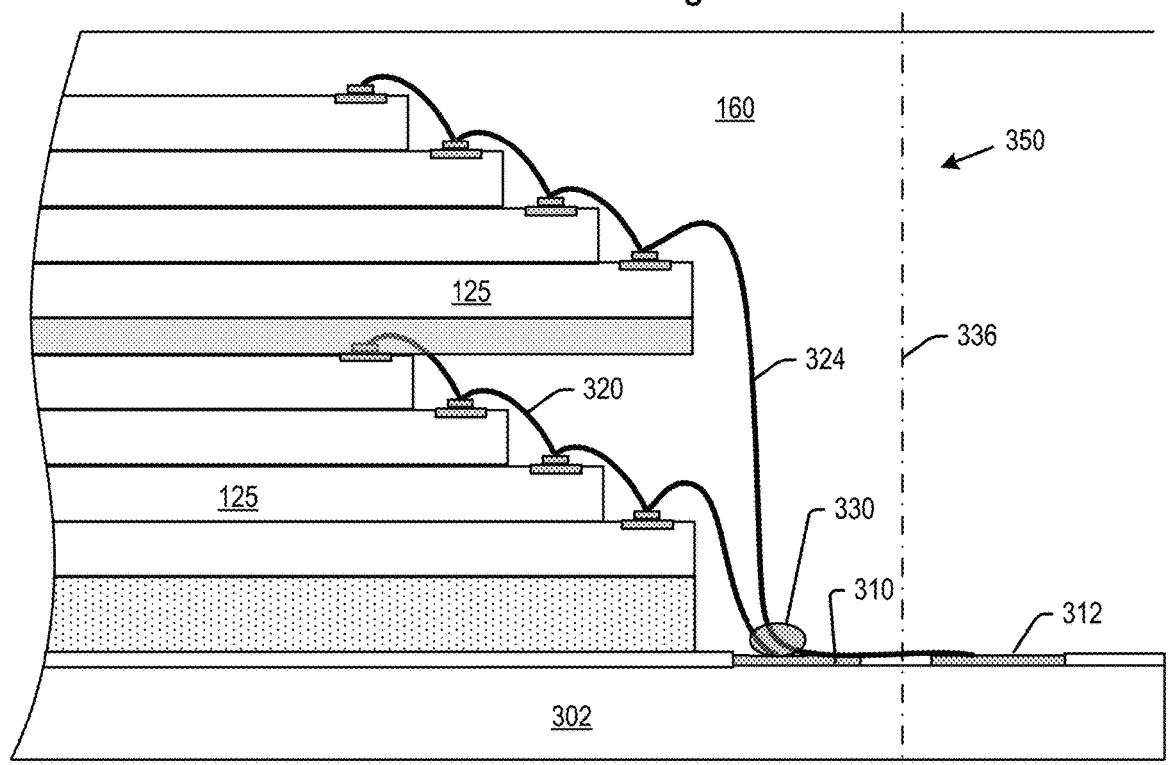
FIG. 26 is an enlarged side view of the semiconductor dies and substrate shown in FIG. 23, further including a solder ball embedding the bond wires.

In embodiments, in forming the wire connection between the bottommost die 125 in the second group and the dummy contact fingers 312, the loop passes directly adjacent or just above the contact fingers 310 as shown in FIGS. 25 and 26. Wire bonding techniques allow for bends in a wire as it is payed out of the wire bond capillary, so that the wire 324 can extend down toward the contact fingers 310, and then veer toward the dummy contact fingers 312, where the bond is formed.

Referring now to FIG. 26, once the wire bonds are formed using bond wires 320 and 324, a bonding ball 330 may be deposited on each contact finger 310 of substrate 302. Wires 320 and 324 both get embedded within bonding ball 330 as it is formed, fixing and electrically coupling the wires 320 and 324 to each other and the respective contact fingers 310. Bonding ball 330 may for example be a solder alloy, including for example a Tin/Silver/Copper alloy, a Tin/Silver alloy, a Tin/Lead alloy, a Gold/Tin alloy, an Indium/Tin alloy or a Tin/Bismuth alloy. Other materials are contemplated.

The bonding ball may be applied by various methods including for example by laser alloy ball jetting. Such a process is a known process, performed for example by Pac Tech—Packaging Technologies GmbH of Nauen, Germany. However, in general, the process involves ejecting a solder ball from a capillary as it is reflowed by a laser within the capillary. Upon heating by the laser, the solder ball melts around the bond wires 320, 324 and onto the contact fingers 310. Laser ball jetting processes have been found to have advantages in minimizing the negative effects of intermetallic compound formation and optimizing atomic diffusion with the contact finger and bond wires. However, other processes may be used to apply the bonding balls.

Once the wires 320, 324 have been bonded to contact fingers 310 by bonding balls 330, the semiconductor device 350 may be encapsulated in molding compound 160 as described above, and then singulated along cut line 336, which severs the dummy contact fingers 312 from the finished semiconductor device 350.

Figure 27:
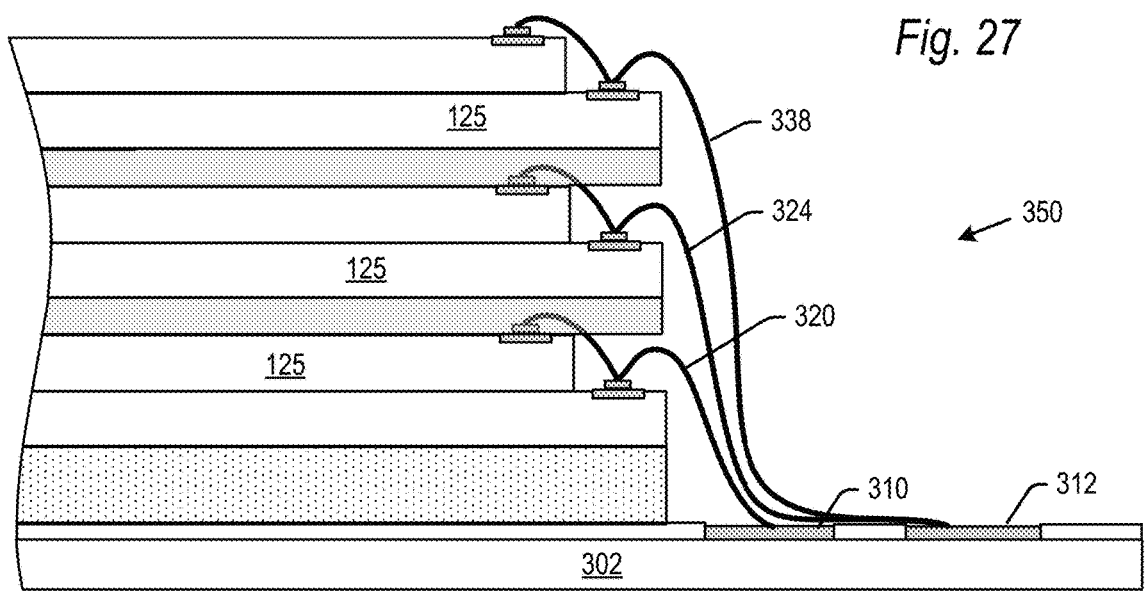
FIG. 27 is an enlarged side view of semiconductor dies and substrate according to an alternative to that shown in FIG. 23.
Figure 28:
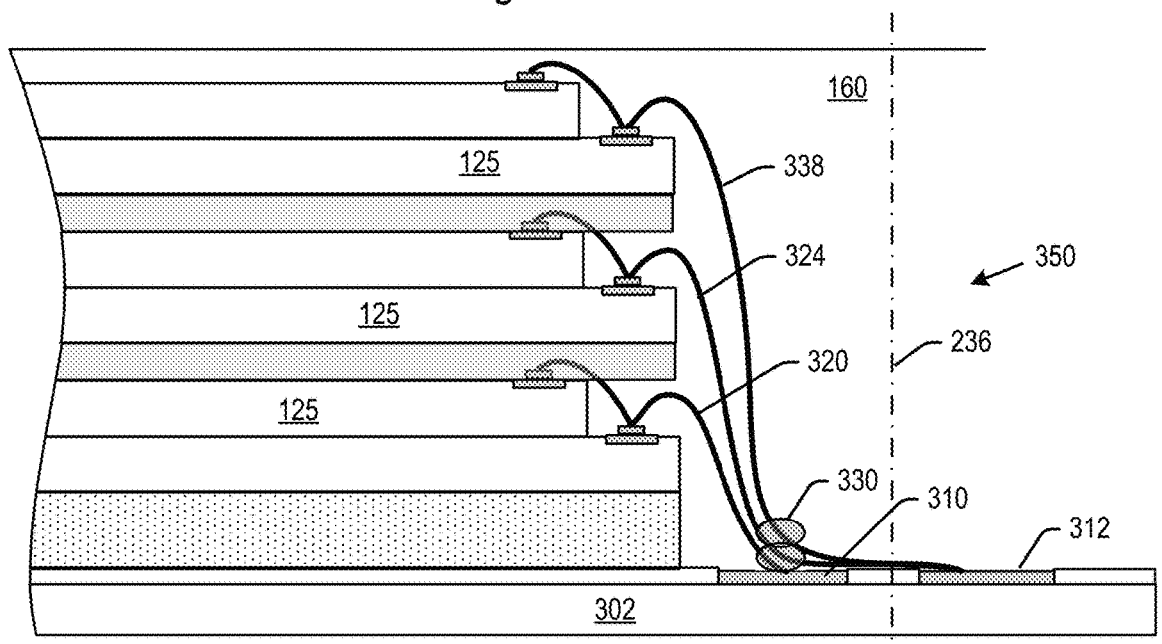
FIG. 28 is an enlarged side view of the semiconductor dies and substrate shown in FIG. 23, further including a pair of solder ball embedding the bond wires.

As noted, the number of die groups may be greater than two in further embodiments. In such embodiments, more than one bonding ball may be applied to the contact fingers if needed to embed all of the wire bonds. Such an embodiment is shown in FIGS. 27 and 28. Three groups of dies 125 are bonded to the substrate 302, with a first (lowermost) group having bond wires 320 bonded to contact fingers 310. The second and third groups of dies have bond wires 324 and 338, respectively, bonded to dummy contact fingers 312. As above, the bond wires 324, 338 may have a low profile, passing directly adjacent or just above the contact fingers 310.

Once the wires 324, 338 are bonded to dummy contact fingers 312, bonding balls 330 may be applied to the contact fingers 310, embedding the bond wires 320, 324 and 338 and bonding them to contact fingers 310. As shown, the bonding balls 330 may be stacked atop each other until the bond wires are embedded. More than two bonding balls may be stacked atop each other in further embodiments. Thereafter, the device 350 may be encapsulated in molding compound 160, and singulated along cut line 336, severing the dummy contact fingers from the device 350. As above, the semiconductor device 350 provides contact fingers having a small footprint while bonding multiple bond wires.

Figure 29:
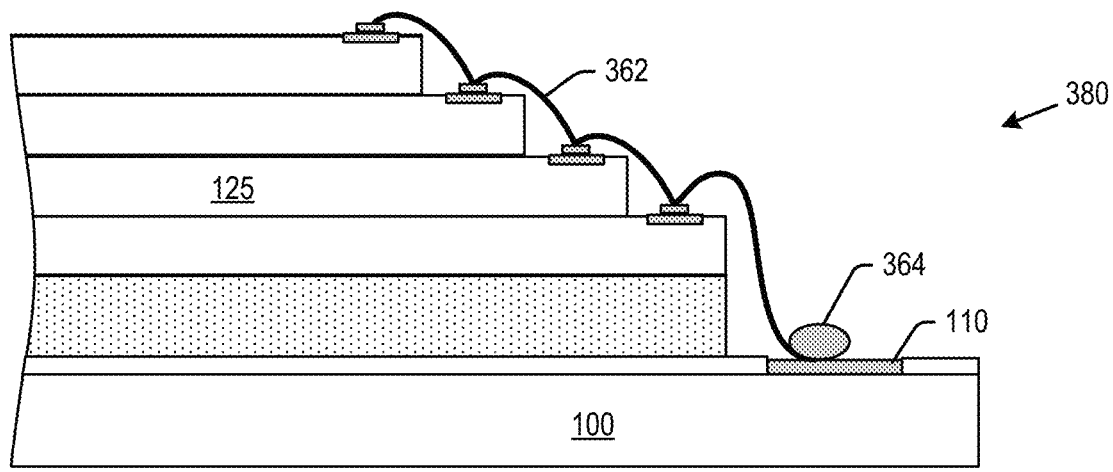
FIG. 29 is an enlarged side view of the semiconductor dies and substrate according to a further embodiment of the present technology.
Figure 30:
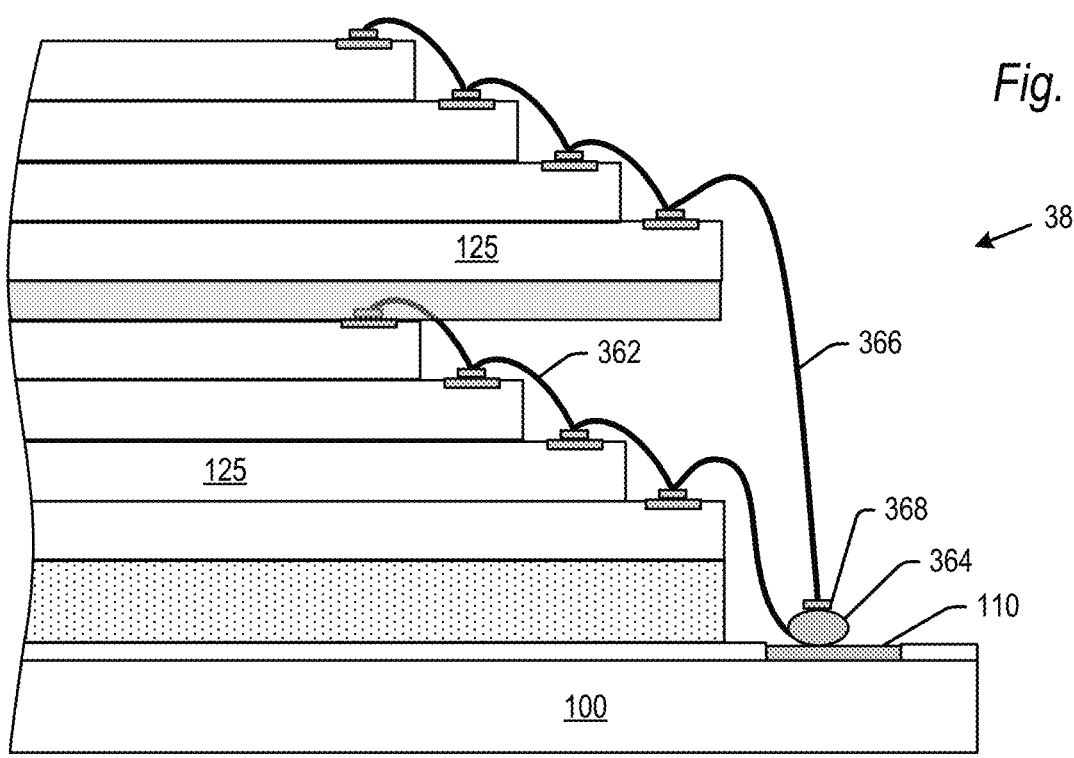
FIG. 30 is an enlarged side view of the semiconductor dies and substrate shown in FIG. 29, further including a solder bump on top of a solder ball.

FIGS. 29 and 30 show a semiconductor package 350 according to a still further embodiment of the present technology. The semiconductor device 380 of FIGS. 29 and 30 is similar in composition and construction to the semiconductor device 150 shown in FIGS. 13 and 14, except that the bond wires are coupled to the contact fingers using a bonding ball as described above with respect to FIGS. 27 and 28. However, in the embodiment of FIGS. 29 and 30, the bond wires do not embed within the bonding ball. In such an embodiment, the dummy contact fingers may be omitted and a substrate 100 as described above with respect to FIGS. 1-21 may be used.

In particular, referring to the enlarged side view of FIG. 29, after the first (lower) group of dies 125 are mounted on substrate 100, a first set of bond wires 362 may be connected between the dies in the first group and the contact fingers. The bonds may be formed by ball bonding techniques including depositing a ball on a first die bond pad of the bottommost die, paying out wire, and stitch bonding onto the first contact finger. Wire bonding may continue up and across the dies in the first group. Thereafter, a bonding ball 364 may be deposited on top of the stitch bonds on the contact fingers 110 and allowed to harden (either at room temperature or in a curing process).

Next, referring to the enlarged side view of FIG. 30, after the second (upper) group of dies 125 are mounted on the first group of dies, a second set of bond wires 366 may be connected between the dies in the second group and the contact fingers 110. In accordance with this embodiment, a ball bump 368 may be deposited on top of the bonding ball 364. Thereafter, the wire bond capillary may deposit a ball on a first die bond pad of the bottommost die, pay out wire, and stitch bond onto the ball bump 364. Wire bonding may then continue up and across the dies in the second group in the same manner.

Once completed, the semiconductor device 380 may be encapsulated and singulated as described above. As above, the semiconductor device 380 provides contact fingers having a small footprint while bonding multiple bond wires. In embodiments, the contact fingers 110 of FIGS. 29-30 may have a length and/or width of 50 µm to 70 µm, such as for example 55 µm.

In summary, in one example, the present technology relates to a semiconductor substrate, comprising: a first surface; and a plurality of contact fingers formed in the first surface, the plurality of contact fingers each configured to receive a plurality of wire bonds while having an area that is smaller than an area required to accommodate two or more side-by-side wire bonds.

In a further example, the present technology relates to a semiconductor device, comprising: a substrate, comprising: a first surface, and a plurality of contact fingers formed in the first surface; a plurality of semiconductor dies; and a plurality bond wires coupled to the plurality of semiconductor dies, a bond wire from each of the plurality of semiconductor dies bonded to a single contact finger of the plurality of contact fingers, the plurality of bond wires bonded to the single contact finger in a vertical column In another example, the present technology relates to a semiconductor device, comprising: a substrate, comprising: a first surface, and a plurality of contact fingers formed in the first surface, a contact finger of the plurality of contact fingers having a length of between 50 µm to 70 µm, and a width of between 50 µm to 70 µm; at least two groups of semiconductor dies, each group comprising one or more semiconductor dies; and electrical coupling means for electrically coupling a semiconductor die from each group to the single contact finger.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
a substrate, comprising:
a first surface; and
a plurality of contact fingers formed in the first surface; and
a plurality of bond wires, each bond wire having an end with a ball bump, each ball bump of the plurality of bond wires stacked vertically on a contact finger of the plurality of contact fingers;
wherein the contact finger has an area that is smaller than an area required to accommodate two or more bond wires of the plurality of bond wires mounted side-by-side on the contact finger.

2. The semiconductor device of claim 1, wherein the contact finger is configured to receive between 2 and 6 bond wires.

3. The semiconductor device of claim 1, further comprising a solder mask applied over the first surface, the solder mask etched to form a window over each of the plurality of contact fingers.

4. The semiconductor device of claim 1, wherein the contact finger has a length of between 50 µm to 70 µm, and a width of between 50 µm to 70 µm.

5. The semiconductor device of claim 1, wherein the end of each bond wire further comprises a stitch bond formed at the end of each of the plurality of bond wires.

6. The semiconductor device of claim 1, wherein the plurality of semiconductor dies comprise between 2 and 6 semiconductor dies.

7. The semiconductor device of claim 1, wherein the contact finger of the plurality of contact fingers has an area that is less than 28% larger than an area of a ball bump directly affixed to the contact finger.

8. The semiconductor device of claim 1, wherein each of the plurality of semiconductor dies belongs to a different group of semiconductor dies, each group of semiconductor dies comprising at least two semiconductor dies stacked on each other within the semiconductor device.

9. The semiconductor device of claim 8, wherein the plurality of semiconductor dies comprise a bottommost semiconductor die in each group of stacked semiconductor dies, a bond wire of the plurality of bond wires extending directly between the bottommost semiconductor die and the contact finger.

10. The semiconductor device of claim 9, wherein the plurality of semiconductor dies each comprise an edge including die bond pads, the edges of the plurality of semiconductor dies aligned with each other in a reference plane.

11. The semiconductor device of claim 8, wherein the groups comprise between 2 and 6 groups of semiconductor dies, and the plurality of bond wires bonded to a single contact finger comprise between 2 and 6 bond wires.

12. A semiconductor device, comprising:
   a substrate, comprising:
   a first surface, and
   a plurality of contact fingers formed in the first surface;
   at least two groups of semiconductor dies stacked on the first surface, each group comprising one or more semiconductor dies;
   a plurality of bond wires extending directly between a semiconductor die from each group of semiconductor dies and the contact fingers, each bond wire having an end with a ball bump, each ball bump of the plurality of bond wires stacked vertically on a contact finger of the plurality of contact fingers;
   wherein the contact finger has an area that is smaller than an area required to accommodate two or more bond wires of the plurality of bond wires mounted side-by-side on the contact finger.

13. The semiconductor device of claim 12, wherein the at least two groups of semiconductor dies comprise between 2 and 6 groups, each group comprising between 2 and 4 semiconductor dies.

14. The semiconductor device of claim 12, wherein a contact finger of the plurality of contact fingers has a length of between 50 μm to 70 μm, and a width of between 50 μm to 70 μm.

15. The semiconductor device of claim 12, wherein the contact finger is configured to receive between 2 and 6 bond wires.

16. The semiconductor device of claim 12, wherein the groups of semiconductor dies comprise between 2 and 6 semiconductor dies.

17. The semiconductor device of claim 12, wherein the groups of semiconductor dies comprise between 2 and 4 groups of semiconductor dies.

18. The semiconductor device of claim 12, wherein the contact finger of the plurality of contact fingers has an area that is less than 28% larger than an area of a ball bump directly affixed to the contact finger.

* * * * *